United States Patent
Curd et al.

[11] Patent Number: 6,121,795
[45] Date of Patent: Sep. 19, 2000

[54] LOW-VOLTAGE INPUT/OUTPUT CIRCUIT WITH HIGH VOLTAGE TOLERANCE

[75] Inventors: Derek R. Curd; Hy V. Nguyen, both of San Jose, Calif.

[73] Assignee: Xilinx, Inc., San Jose, Calif.

[21] Appl. No.: 09/031,389

[22] Filed: Feb. 26, 1998

[51] Int. Cl.$^7$ ............................................. H03K 19/0175
[52] U.S. Cl. ................................. 326/83; 326/81; 326/57
[58] Field of Search ................................. 326/37, 56, 57, 326/58, 80, 81, 83, 86, 121; 327/390

[56] References Cited

U.S. PATENT DOCUMENTS

| | | | |
|---|---|---|---|
| 5,144,166 | 9/1992 | Camarota et al. | 326/39 |
| 5,270,589 | 12/1993 | Sawada et al. | 307/475 |
| 5,329,186 | 7/1994 | Hush et al. | 307/482 |
| 5,448,198 | 9/1995 | Toyoshima et al. | 327/530 |
| 5,532,621 | 7/1996 | Kobayashi et al. | 326/81 |
| 5,570,043 | 10/1996 | Churchill | 326/81 |
| 5,680,071 | 10/1997 | Senoh et al. | 327/390 |
| 5,917,348 | 6/1999 | Cho | 327/108 |

OTHER PUBLICATIONS

"The Programmable Logic Data Book", (1996), available from Xilinx, Inc., 2100 Logic Drive, San Jose, California 95124, pp. 3–3 through 3–13.

*Primary Examiner*—Michael Tokar
*Assistant Examiner*—Anh Tran
*Attorney, Agent, or Firm*—Bever, Hoffman & Harms, LLP; Patrick T. Bever; Lois D. Cartier

[57] ABSTRACT

An input/output (I/O) circuit for transmitting output signals on or receiving input signals from an I/O terminal of an integrated circuit device, such as a Programmable Logic Device (PLD). The I/O circuit includes pull-up and pull-down transistors for generating output signals on the I/O terminal in an output mode, and an isolation transistor for limiting the voltage level transmitted to the pull-up transistor from the I/O terminal in an input mode. The isolation transistor is formed with a thicker gate oxide and a longer channel length than that of the pull-up and pull-down transistors, thereby allowing the isolation transistor to withstand voltages greater than Vcc of the PLD without damage. The isolation transistor is controlled using a charge pump provided on the PLD for programming non-volatile memory cells (e.g., EPROM, EEPROM or flash EPROM cells). The isolation transistor is produced during the same process steps used to produce high voltage transistors associated with the non-volatile memory cells.

8 Claims, 2 Drawing Sheets

LOW-VOLTAGE INPUT/OUTPUT CIRCUIT WITH HIGH VOLTAGE TOLERANCE

FIELD OF THE INVENTION

This invention relates to the field of integrated circuits, and more specifically to input/output circuits for interfacing programmable logic devices with other integrated circuit devices in systems utilizing more than one power supply level.

BACKGROUND OF THE INVENTION

Integrated Circuit (IC) devices typically include numerous transistors that are fabricated on, for example, silicon wafers. There are several types of IC devices, including Application Specific Integrated Circuit (ASIC) devices and Programmable Logic Devices (PLDs). ASIC devices include logic elements connected by dedicated (hard-wired) interconnect lines such that each ASIC device performs a predetermined (fixed) logic operation. ASIC devices include dedicated input pins for receiving input signals, and dedicated output pins (terminals) for transmitting output signals to other devices. The function (input or output) of each pin of an ASIC device is fixed during production. In contrast to ASIC devices, PLDs include undedicated (user-configurable) logic elements and interconnect resources that are programmable to implement user-defined logic operations (that is, a user's circuit design). The function (input or output) of each data pin on a PLD is typically determined after production. To provide this optional functionality, PLD pins are typically connected to the logic elements and interconnect resources through user programmable input/output (I/O) circuits. Pins that are connected to these I/O circuits are referred to as I/O pins.

FIG. 1 is a diagram showing a portion of an I/O circuit 100 that is used in known PLDS. I/O circuit 100 is programmed to operate in either an input mode or an output mode by an output enable (OE) signal that is generated by the internal logic circuitry or transmitted on a global bus line of a PLD. The OE signal is transmitted to the first input terminal of a two-input NAND gate 110, and through an inverter 120 to the first input terminal of a two-input NOR gate 130. I/O circuit 100 also receives data output (DATA OUT) signals from internal circuitry of a PLD (not shown). The DATA OUT signals are transmitted to the second input terminals of NAND gate 110 and NOR gate 130. The output signal of NAND gate 110 is transmitted on line 115 to the gate of a PMOS pull-up transistor 140 that is connected between Vcc and a PLD I/O pin 160. The output signal of NOR gate 130 is transmitted on line 135 to the gate of an NMOS pull-down transistor 150 that is connected between I/O pin 160 and ground. I/O pin 160 is also connected through an input buffer 170, which includes serially-connected inverters 172 and 174, to a DATA IN line that transmits data input signals to the internal circuitry of the PLD (not shown).

As mentioned above, I/O circuit 100 operates in two modes: an output mode in which I/O pin 160 is used for transmitting output signals from the PLD, and an input mode in which I/O pin 160 is used for receiving input signals from an external source or device, and passing the input signals to the internal portions of the PLD. In the output mode, a high OE signal causes pull-up transistor 140 and pull-down transistor 150 to generate high (Vcc) and low (0V or ground) signals on I/O pin 160 in response to DATA OUT signals. In the input mode, a low OE signal tri-states the output driver formed by PMOS pull-up transistor 140 and NMOS pull-down transistor 150, thereby disconnecting the DATA OUT line from I/O pin 160. That is, the low OE signal causes NAND gate 110 and NOR gate 130 to generate high and low output signals, respectively, regardless of any DATA OUT signal. The high signal from NAND gate 110 and the low signal from NOR gate 130 respectively maintain pull-up transistor 140 and pull-down transistor 150 in off states. With pull-up transistor 140 and pull-down transistor 150 turned off, input signals pass unimpeded from I/O pin 160 through input buffer 170 to the internal portions of the PLD on the DATA IN line.

As is the case with the majority of IC manufacturers, PLD manufacturers are constantly striving to improve the performance and reduce the cost of the devices they produce. The primary means of achieving these two very important goals is through migration to processing technologies with ever-smaller geometries. Semiconductor devices are commonly produced using, for example, a 0.5 micron (um) process technology, where "0.5 micron" refers to the minimum channel length of transistors that can be reliably produced with that particular technology. In addition to reduced channel lengths, more advanced processes typically have significant reductions in other geometries as well, such as metal pitch, diffusion spacing, gate oxide thickness, etc. These smaller geometries naturally result in devices with smaller die size, which can substantially reduce the per-die cost of manufacturing. Typically, the smaller process dimensions also result in significant performance improvements. Gate and interconnect delays are normally reduced as a product of enhanced transistor performance and diminished parasitic loading.

Currently, many semiconductor manufacturers are migrating from industry-standard 0.6 and 0.5 um technologies to advanced 0.35 um and 0.25 um technologies. IC devices produced using 0.6 and 0.5 um technologies typically operated on 5V power supplies. However, in the advanced process technologies, the gate oxide thickness and channel length of the transistors is normally reduced to a point where 3.3V supplies (or lower) will be commonly used. I/O circuit 100 provides reliable operation in 5V PLDS, but can cause problems when utilized in 3.3V PLDS. All PLDs are typically incorporated into systems in which they communicate with (i.e., send output signals to and receive input signals from) other IC devices, such as TTL or CMOS logic devices. When a PLD and all other devices in such a system operate on a common supply (e.g., 5V or 3.3V), I/O circuit 100 reliably functions in both the input mode and the output mode. For example, when a 5V PLD (i.e., Vcc of the PLD is 5V) is incorporated into a system including TTL or CMOS devices, the signals received at I/O pin 160 associated with a particular I/O circuit 100 does not exceed 5.5 volts. Therefore, the voltage differential (ΔV) across pull-up transistor 140 does not exceed one P-channel threshold voltage (Vtp) above Vcc, so pull-up transistor 140 remains off. Similarly, when a 3.3V PLD is incorporated into a system including only 3.3V devices, pull-up transistor 140 is not subjected to a ΔV that exceeds one Vtp above Vcc. However, problems may occur when a 3.3V PLD is incorporated into a system including 5V devices. Of course, a 3.3V PLD can safely drive its own I/O pin in such a system when the I/O pin is being used for data output. However, when the I/O pin of a 3.3V PLD is being driven by a neighboring 5V device (i.e., in the input mode), the 5V signals applied to the I/O pin may damage the transistors of the I/O circuit and/or cause significant current leakage. Damage to I/O circuit 100 is particularly problematic when the 3.3V PLD is produced using advanced 0.35 or smaller process technologies. In this case, pull-up transistor 140, pull-down transistor 150 and input buffer 170 may be damaged by the 5V signal on I/O pin 160 due to their thinner gate oxides and shorter channel lengths that will result in excessive electric fields. Even if a 3.3V PLD is produced using 0.5 um process technologies, 5V signals on I/O pin 160 produce current leakage through pull-up transistor 140. In particular, as shown in FIG. 1, it is common practice to tie the N-well of PMOS pull-up transistor 140 to Vcc (e.g., 3.3V). In this case, when I/O pin 160 is raised to 5V or more, the resulting potential across pull-up transistor 140 forward biases a parasitic diode 180 created by the P-N junction between the I/O pin node and the N-well of PMOS pull-up transistor 140 (i.e., $\Delta V=1.7V$, which is greater that $Vtp \approx 0.7V$). Forward-biased parasitic diode 180 produces excessive current leakage and causes pull-up transistor 140 to function incorrectly. Finally, even if the N-well of pull-up transistor 140 were not tied to Vcc, a leakage problem would still exist. Specifically, the signal on line 115 that is applied to the gate of pull-up transistor 140 is Vcc (3.3V) in the input mode in order to maintain pull-up transistor 140 in an off state. However, if the voltage at I/O pin 160 exceeds the voltage on line 115 by one p-channel threshold voltage (where $Vtp \approx 0.7V$), pull-up transistor 140 will turn on and sink I/O pin 160 into Vcc, again creating excessive leakage.

What is needed is an improved low voltage I/O circuit with a high voltage tolerance that avoids the above-mentioned problems associated with the prior art I/O circuits, and is implemented using processes that are consistent with the fabrication of other portions of the IC or PLD upon which the I/O circuit is formed.

SUMMARY OF THE INVENTION

The present invention is directed to an input/output (I/O) circuit that is connected between an I/O terminal and the internal logic circuits of an integrated circuit (IC) device, such as a Programmable Logic Device (PLD). The I/O circuit includes pull-up and pull-down transistors for generating output signals on the I/O terminal in an output mode, and an isolation transistor for limiting the voltage applied across the pull-up transistor by the I/O terminal in an input mode. The isolation transistor is formed with a thicker gate oxide and a longer channel length than that of the pull-up and pull-down transistors, thereby allowing the isolation transistor to withstand input voltages that are greater than Vcc of the IC device without damage. In one embodiment, the isolation transistor is controlled using the high programming voltage generated by a charge pump that is provided on the IC device for programming non-volatile memory cells (e.g., EPROM, EEPROM or flash EPROM cells). In addition, the isolation transistor is produced during the same process steps that are used to produce high voltage programming transistors associated with the non-volatile memory cells. Therefore, the isolation transistor is implemented without requiring a special voltage source and without changing established process steps.

In accordance with a first embodiment of the present invention, an I/O circuit includes a pull-up transistor and a pull-down transistor connected between Vcc and ground, and an isolation transistor connected between an I/O terminal and the pull-up and pull-down transistors. During an input mode, the isolation transistor limits the amount of voltage at the pull-up and pull-down transistors to Vcc. Therefore, the present invention provides an I/O circuit that tolerates input signal voltages that are significantly greater than Vcc without current leakage or the threat of damage to the pull-up/pull-down transistors.

In accordance with a second embodiment, the isolation transistor is located between the pull-up transistor and the I/O pin, but the pull-down transistor is connected directly to the I/O pin. Similar to the first embodiment, the isolation transistor is formed with a gate oxide thickness and a channel length that are sufficiently large enough to withstand input signal voltages significantly above Vcc without damage. In accordance with the second embodiment, the pull-down transistor is also formed as a high voltage transistor. This provides an additional benefit in some applications because it minimizes the size of the pull-down transistor, which typically requires stronger drive in comparison to the pull-up transistor, by allowing it to drive the I/O pin directly rather than through the isolation transistor.

In accordance with another embodiment, the I/O circuit includes an input buffer that is connected to the I/O pin through a second isolation transistor whose gate is tied to Vcc. High voltage signals applied to the I/O pin are passed through the second isolation transistor at an intermediate level somewhat below Vcc. The input buffer includes a first inverter and a second inverter connected in series, and a second pull-up transistor that is connected between Vcc and an input terminal of the first inverter. The second pull-up transistor has a gate connected to the output of the first inverter, thereby turning on when the output of the first inverter is low, and turning off when the output of the first inverter is high. Therefore, the intermediate level signals from the second isolation transistor at the input of the first inverter are restored to Vcc by the half latch provided by second pull-up transistor. This optional arrangement assures reliable operation of input buffer, particularly when a significant distance separates the I/O pin and the input buffer.

DETAILED DESCRIPTION OF THE DRAWINGS

The present invention is directed to a programmable I/O circuit that is utilized in integrated circuit (IC) devices, and in particular in PLDs, such as a Complex Programmable Logic Device (CPLD).

Figure 1:
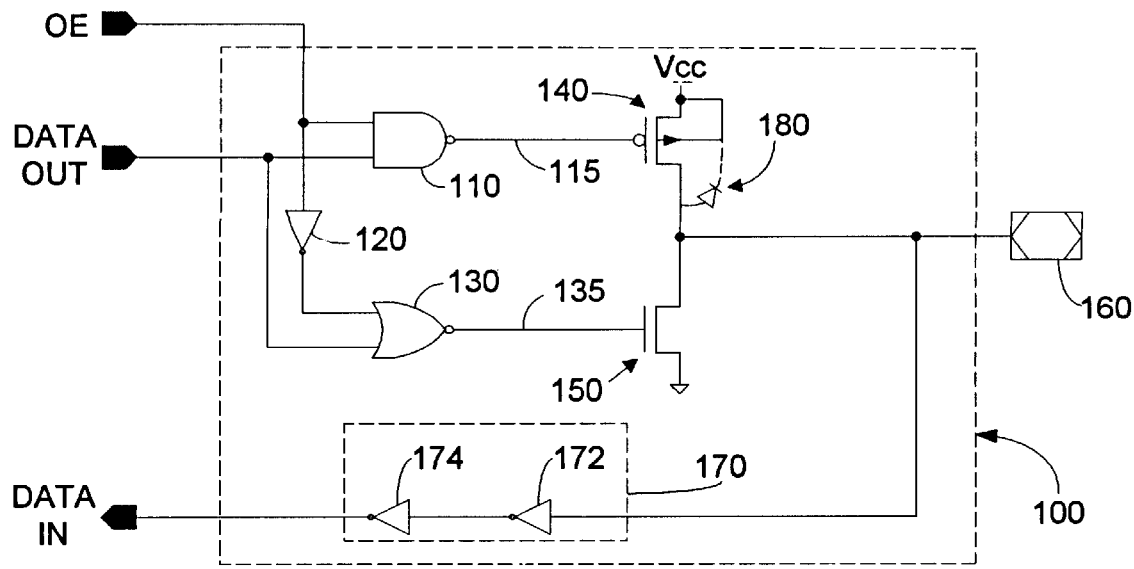
FIG. 1 is a diagram showing a portion of a prior art I/O circuit used in known PLDs.
Figure 2:
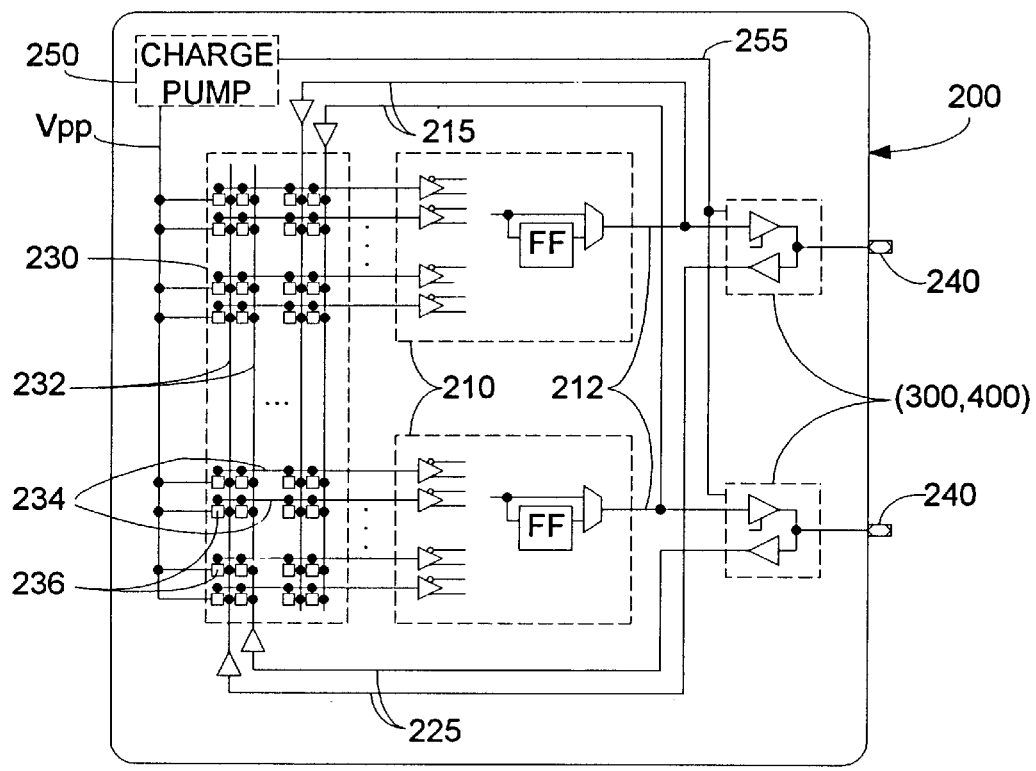
FIG. 2 is a simplified circuit diagram showing a Complex Programmable Logic Device (CPLD) that represents one type of Programmable Logic Device (PLD).

FIG. 2 shows a portion of a CPLD 200, which represents one of several PLD types that are currently available. Although greatly simplified, CPLD 200 is generally consistent with XC9500™ series CPLDs that are produced by Xilinx, Inc. of San Jose, Calif. CPLD 200 includes configurable function blocks (FBs) 210 and a programmable interconnect matrix (interconnect resources) 230. These circuits are briefly described in the following paragraphs. Additional detail regarding the structure and function of these circuits is provided in *The Programmable Logic Data Book*, published by Xilinx, Inc. (Version 1.02, 1996) on pages 3-3 through 3-13 (incorporated herein by reference).

Each FB 210 of CPLD 200 includes configurable combinational circuitry that is programmable to generate a desired logic function in response to input signals received from interconnect matrix 230. Each FB 210 is configurable to generate combinational output signals (i.e., the output signals are transmitted directly to an output line 212), or registered output signals (i.e., the output signals are routed through a flip-flop (FF) to output line 212). Each output signal on output line 212 is either transmitted to an I/O circuit 300,400, or is fed-back to interconnect matrix 230 on feedback lines 215. Typically, the combinational circuitry of all FBs 210 in CPLD 200 is identical.

Interconnect matrix 230 is provided to selectively route feedback and input signals to designated FBs 210 in accordance with a user's logic operation. Interconnect matrix 230 includes word lines 232, bit lines 234 and programmable connection switches 236. Each word line 232 receives either a feedback signal from a feedback line 215 or an input signal from an input line 225. Each bit line 234 is programmably coupled to several word lines 232 via connection switches 236. Connection switches 236 typically include non-volatile memory devices such as EPROM, EEPROM or flash-EPROM cells. When programmed, each memory device is activated by high (or low) signals on an associated word line to pull-down the voltage on an associated bit line 234. This formation allows interconnect matrix 230 to route input and feedback signals onto a bit line 234 that is coupled to a designated FB 210. In addition, input and/or feedback signals on two or more word lines 232 can be logically ANDed together before transmission to a designated FB 210 by programming the connection switches 236 that are connected between these associated word lines 232 and a single bit line 234.

It is very common for PLDs to use fabrication processes that can support both "low-voltage" and "high-voltage" transistors. The high-voltage transistors are generally processed with thicker gate oxides, longer channel lengths, and possibly special process parameters so that they can tolerate programming voltages (Vpp) from 8 up to 15 Volts. As mentioned above, these high-voltage levels are generated by, for example, a charge pump 250 and are required to program and erase the non-volatile memory cells (e.g., EPROM, EEPROM, Flash EPROM, etc.) that are commonly found, for example, in the connection switches 236 of interconnect matrix 230 of PLD 200. Charge pumps are well known in the art and are capable of generating voltage levels above the power supply voltage (Vcc) of an IC by "boot-strapping" multiple stages of capacitors to achieve the desired voltage level (e.g., Vpp).

In addition to FBs 210 and interconnect matrix 230, each CPLD 200 includes an input/output (I/O) circuit 300,400 that is produced in accordance with the present invention. Although the present invention is described below with reference to CPLD 200, the present invention may be beneficially utilized in other types of PLDs and ICs. Therefore, the appended claims should not be limited to CPLD applications of the disclosed I/O circuit.

I/O circuits 300,400 are provided so that each I/O pin 240 of CPLD 200 can be used for either signal input operations or signal output operations. As discussed above, PLDs are typically manufactured without knowing which pins 240 will be used for input signals and which will be used for output signals. To facilitate optional use of these undedicated pins, I/O circuits 300,400 operate either to transmit input signals from an I/O pin 240 to an input line 225, or transmit output signals from an FB 210 to an I/O pin 240.

Figure 3:
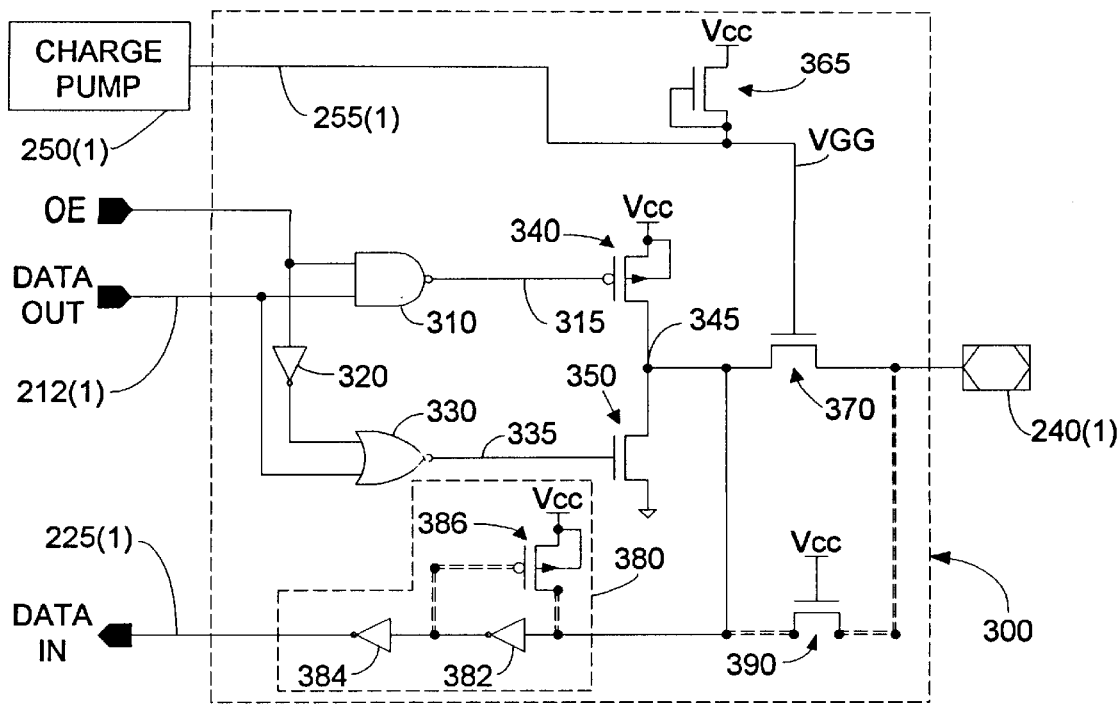
FIG. 3 is a diagram showing an I/O circuit according to a first embodiment of the present invention.

FIG. 3 is a simplified diagram showing an I/O circuit 300 in accordance with a first embodiment of the present invention. I/O circuit 300 receives an output enable (OE) signal that is generated within an FB 210 (FIG. 2) or transmitted on a global bus line (not shown) of CPLD 200. The OE signal is transmitted to the first input terminal of a two-input NAND gate 310, and through an inverter 320 to the first input terminal of a two-input NOR gate 330. Data output signals from an FB 210 of CPLD 200 (not shown) are also received by I/O circuit 300 on FB output (DATA OUT) line 212(1). The data output signals are transmitted to the second input terminals of NAND gate 310 and NOR gate 330. The output signal of NAND gate 310 is transmitted on line 315 to the gate of a PMOS pull-up transistor 340 that is connected between Vcc and a first node 345. The output signal of NOR gate 330 is transmitted on line 335 to the gate of an NMOS pull-down transistor 350 that is connected between first node 345 and ground. An NMOS isolation transistor 370 is connected between first node 345 and I/O pin 240(1). First node 345 is also connected through an input buffer 380, which includes serially-connected inverters 382 and 384, to a data input (DATA IN) line 225(1).

An isolation drive (second) voltage VGG, which is greater than Vcc, is generated by charge pump 250(1) of CPLD 200 and is transmitted to a gate of isolation transistor 370 via line 255(1). As discussed above, charge pump 250(1) is used to generate programming voltages (Vpp) in the range of 8V to 15V for the purpose of programming or erasing the non-volatile memory cells of CPLD 200. The second voltage VGG is clamped to an n-channel threshold voltage above Vcc by optional clamp transistor 365. In the disclosed embodiment, VGG is derived from charge pump 250(1). Because charge pump 250 is already provided on CPLD 200 for programming the non-volatile memory cells of CPLD 200, the cost associated with the generation of VGG is minimal. However, in another embodiment, one or more dedicated charge pumps 250(1) may be provided on CPLD 200 that generate VGG without the need for clamp transistor 365.

As discussed above, CPLD 200 (FIG. 2) includes high voltage transistors for transmitting Vpp from charge pump 250 to the non-volatile memory cells (e.g., EPROM, EEPROM, Flash EPROM, etc.) that are commonly found, for example, in the connection switches 236. In accordance with the present invention, isolation transistor 370 is formed using the same process steps and dimensions used to produce these high voltage program/erase transistors. That is, isolation transistor 370 is formed with a thicker gate oxide and longer channel length than that of pull-down transistor 350 and pull-up transistor 340. As such, isolation transistor 370 is able to better withstand input signals of up to 5.5V that are applied to I/O pin 240(1) without damage. Further, because isolation transistor 370 is produced during the same steps used to produce the high voltage program/erase transistors, the number of process steps necessary to generate CPLD 200 with I/O circuit 300 is not increased, thereby avoiding higher fabrication costs.

I/O circuit 300 operates in two modes: an output mode in which I/O pin 240(1) is used for transmitting output signals from CPLD 200 (FIG. 2), and an input mode in which I/O pin 240(1) is used for receiving input signals from an external source or device, and passing the input signals to the internal portions of CPLD 200. During operation in both the input and output mode, isolation transistor 370 is driven by VGG such that it will pass a signal in either direction (i.e., input signals from I/O pin 240(1) to node 345, or output signals from node 345 to I/O pin 240(1)) having a voltage level up to an n-channel threshold voltage (Vtn) below the gate voltage VGG. Specifically, because VGG is clamped to one Vtn above Vcc, isolation transistor 370 will pass signals having a voltage level of Vcc or less. Beyond this level, isolation transistor 370 will enter its "cut-off" region, effectively isolating node 345 from input signals greater than Vcc that are received by I/O pin 240(1).

When I/O circuit 300 is operating in the output mode, the signal on the OE line is high, thereby applying a high (Vcc) signal to the first input terminal of NAND gate 310 and a low (0V or ground) signal to the first input terminal of NOR gate 330. Subsequently applied data output signals, which are transmitted from FB 210 (FIG. 2) on data output line 212(1), are transmitted to the second input terminals of NAND gate 310 and NOR gate 330. When the data output signal is low, NAND gate 310 generates a high output signal on line 315 that turns off pull-up transistor 340, and NOR gate 330 generates a high output signal on line 335 that turns on pull-down transistor 350. With pull-up transistor 340 turned off and pull-down transistor 350 turned on, first node 345 is pulled low. Because this low signal is less than Vcc, it is passed through isolation transistor 370 to I/O pin 240(1). Conversely, when the data output signal is high, NAND gate 310 generates a low output signal on line 315 that turns on pull-up transistor 340, and NOR gate 330 generates a low output signal on line 335 that turns off pull-down transistor 350. As a result, node 345 is pulled up to Vcc. Again, because this high signal is equal to Vcc, it is passed through isolation transistor 370 to I/O pin 240(1). In this way, data output signals are transmitted from an FB 210 (FIG. 2) of CPLD 200 on data output line 212(1) and I/O circuit 300 to I/O pin 240(1).

When I/O circuit 300 is operating in the input mode, NAND gate 310 and NOR gate 330 are tri-stated by a low OE signal. The resulting low and high signals cause NAND gate 310 and NOR gate 330 to generate high and low output signals, respectively, regardless of any signal received on data output line 212(1). The high signal from NAND gate 310 and the low signal from NOR gate 330 respectively maintain pull-up transistor 340 and pull-down transistor 350 in off states. With pull-up transistor 340 and pull-down transistor 350 turned off, input signals applied to I/O pin 240(1) are transmitted to I/O buffer 380 through isolation transistor 370. Again, because isolation transistor only passes signals up to Vcc, if a 5V signal is received on I/O pin 240(1), a 3.3V (Vcc) signal is transmitted to input buffer 380. Therefore, pull-up transistor 340 and pull-down transistor 350 are not subjected to voltage levels above Vcc, thereby allowing these transistors to be produced using advanced (0.35 um or smaller) processing technologies without the threat of damage due to input signal voltages that are significantly greater than Vcc. Furthermore, PMOS pull-up transistor 340 does not exceed its normal operating range, i.e. no forward bias is present. Additionally, the present invention eliminates the need to use a floating n-well in the formation of PMOS pull-up transistor 340 (typically provided in the prior art), thereby significantly simplifying the fabrication process.

As set forth above, when I/O circuit 300 is incorporated into PLD 200 (FIG. 2)(or other IC device) having a Vcc of 3.3V (or lower), PLD 200 is able to tolerate input voltages significantly above Vcc (e.g., 5.5 volts) without current leakage or the threat of damage to the pull-up/pull-down transistors or the input buffer. In addition, I/O circuit 300 includes a simple construction that takes up a minimal amount of die area, and utilizes production processes and circuit structures already used to produce CPLD 200.

Double dashed lines in FIG. 3 indicate an optional arrangement of I/O circuit 300. In accordance with this optional arrangement, input buffer 380 includes a PMOS transistor 386 that is connected between Vcc and an input terminal of inverter 382, and has a gate connected to a node between inverter 382 and inverter 384. In addition, input buffer 380 is isolated from I/O pin 240(1) by a low-voltage NMOS transistor 390 whose gate is tied to Vcc (3.3V). High voltage signals applied to I/O pin 240(1) are thereby passed through NMOS transistor 390 at a level somewhat below Vcc. The signal at the input of inverter 382 is restored to Vcc by the half latch provided by PMOS transistor 386. This optional arrangement assures reliable operation of input buffer 380, particularly when I/O pin 240(1) and input buffer 380 are physically separated from one another on the die by a significant distance.

Figure 4:
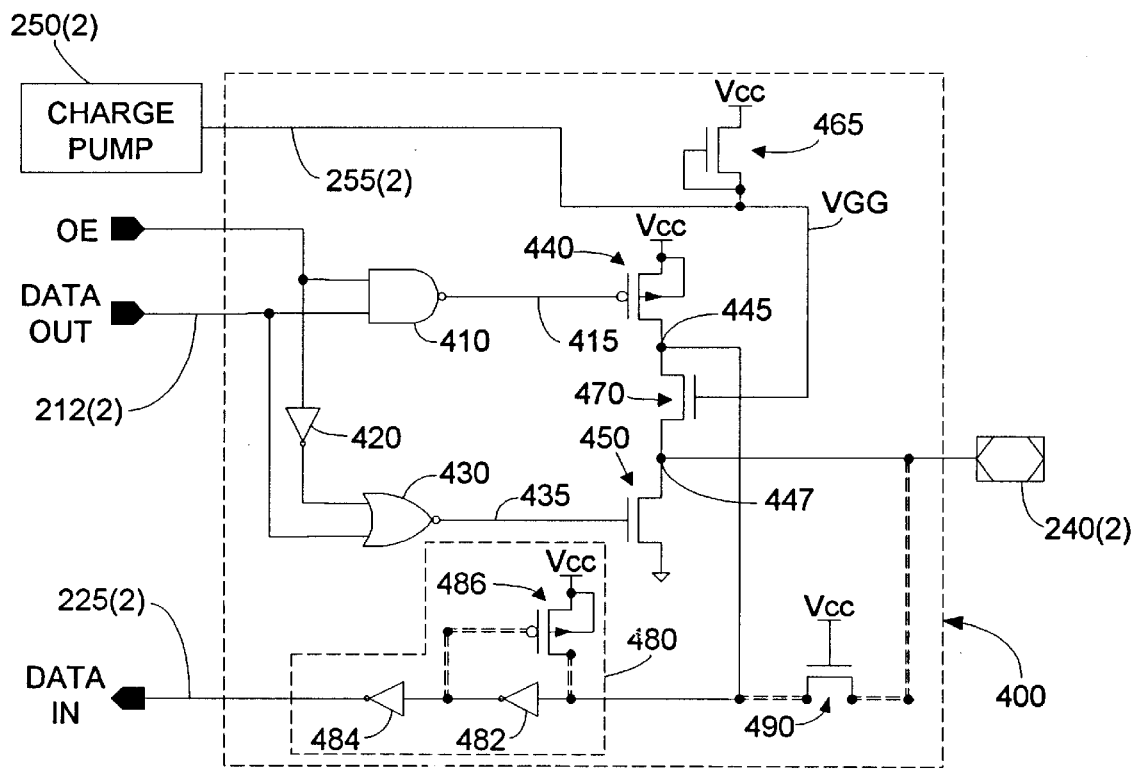
FIG. 4 is a diagram showing an I/O circuit according to a second embodiment of the present invention.

FIG. 4 is a simplified diagram showing an I/O circuit 400 in accordance with a second embodiment of the present invention. The structure and operation of I/O circuit 400 are similar to those of I/O circuit 300 (discussed above). Therefore, the following discussion is specifically directed to the differences between these two circuits.

I/O circuit 400 differs from I/O circuit 300 in the placement of the isolating transistor relative to the pull-up and pull-down transistors. I/O circuit 400 includes PMOS pull-up transistor 440 that is connected between Vcc and a first node 445, and is controlled by a gate signal received on line 415 that is output from NAND gate 410. An NMOS pull-down transistor 450 is connected between ground and a second node 447, and is controlled by a gate signal received on line 435 that is output from NOR gate 430. An NMOS isolation transistor 470 is connected between the first and second nodes, and is controlled by VGG that is transmitted on line 255(2) from charge pump 250(2) and clamped to one Vtn above Vcc by NMOS clamp transistor 465. Similar to the first embodiment, isolation transistor 470 is formed with a gate oxide thickness and a channel length that are sufficiently large enough to withstand 5.5V input voltages without damage. In one embodiment, the gate oxide thickness of isolation transistor 470 is approximately 150 Å and the channel length is about 1 u. Note that other embodiments may include different thicknesses and lengths.

In accordance with the second embodiment, pull-down transistor 450 is also formed as a high voltage transistor (i.e., pull-down transistor 450 and isolation transistor 470 are formed with the same gate oxide thickness and channel length). This formation provides an additional benefit in some applications because it minimizes the area required for pull-down transistor 450, which typically requires stronger drive in comparison to pull-up transistor 440, by allowing it to drive I/O pin 240(2) directly rather than through an isolation transistor. Again, the optional input signal arrangement is shown by the dashed lines in FIG. 4.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. An input/output (I/O) circuit for transmitting output signals on or receiving input signals from an I/O terminal, the I/O circuit comprising:

a pull-up transistor connected between a first voltage source and a first node;

a pull-down transistor connected between a second voltage source and the first node;

an isolation transistor connected between the first node and the I/O terminal; and a clamp transistor having a first terminal, a second terminal and a gate terminal, the first terminal being connected to a first voltage source, and the second terminal being connected to the gate terminal, to a second voltage source, and to a gate terminal of the isolation transistor;

wherein the isolation transistor is formed with a thicker gate oxide and longer channel length than that of the pull-down transistor; and wherein the second voltage source is greater than the first voltage source such that the gate terminal of the isolation transistor is maintained at a voltage level that is one threshold voltage above the first voltage source.

2. The I/O circuit according to claim 1, further comprising an input terminal and an input buffer connected between the first node and the input terminal, and a second isolation transistor connected between the I/O terminal and the input buffer.

3. The I/O circuit according to claim 1, further comprising an input terminal and an input buffer connected between the first node and the input terminal, the input buffer including a first inverter, a second inverter connected in series with the first inverter, and a second pull-up transistor connected between an input of the first inverter and the first voltage source, and having a gate connected to an output of the first inverter.

4. A programmable logic device including an I/O terminal, a function block for transmitting output signals to the I/O terminal in accordance with a desired logic function, and interconnect resources for routing input signals from the I/O terminal to the function block, the programmable logic device comprising:

an input/output (I/O) circuit connected between the function block and the I/O terminal, the I/O circuit including:

a pull-up transistor connected between a first voltage source and a first node, and an isolation transistor connected between the first node and the I/O terminal;

a charge pump for transmitting a second voltage to a gate of the isolation transistor, the second voltage being greater than the first voltage source; and a clamp transistor having a first terminal, a second terminal and a gate terminal, the first terminal being connected to a first voltage source, and the second terminal being connected to the gate terminal and to the charge pump such that the second voltage source is maintained one threshold voltage above the first voltage source;

wherein the isolation transistor is formed with a thicker gate oxide and longer channel length than that of the pull-up transistor.

5. The programmable logic device according to claim 4, wherein the I/O circuit further comprises an input terminal and an input buffer connected between the first node and the input terminal, and a second isolation transistor connected between the I/O terminal and the input buffer.

6. The programmable logic device according to claim 4, wherein the I/O circuit further comprises an input terminal and an input buffer connected between the first node and the input terminal, the input buffer including a first inverter, a second inverter connected in series with the first inverter, and a second pull-up transistor connected between an input of the first inverter and the first voltage source, and having a gate connected to an output of the first inverter.

7. The programmable logic device according to claim 4, wherein the I/O circuit further comprises a pull-down transistor connected between a third voltage source and the first node.

8. The programmable logic device according to claim 7, wherein the isolation transistor is formed with a thicker gate oxide and longer channel length than that of the pull-down transistor.

* * * * *